United States Patent
Ceccaroli et al.

(10) Patent No.: US 6,861,040 B1
(45) Date of Patent: Mar. 1, 2005

(54) REFINING OF METALLURGICAL GRADE SILICON

(75) Inventors: Bruno Ceccaroli, Kristiansand (NO); Kenneth Friestad, Kristiansand (NO)

(73) Assignee: Elkem ASA (NO)

( * ) Notice: Subject to any disclaimer, the term of this patent is extended or adjusted under 35 U.S.C. 154(b) by 347 days.

(21) Appl. No.: 10/149,176

(22) PCT Filed: Aug. 11, 2000

(86) PCT No.: PCT/NO00/00374

§ 371 (c)(1),
(2), (4) Date: Aug. 20, 2002

(87) PCT Pub. No.: WO01/42136

PCT Pub. Date: Jun. 14, 2001

(30) Foreign Application Priority Data

Dec. 8, 1999 (NO) .......................... 19996022

(51) Int. Cl.⁷ ............................ C01B 33/037
(52) U.S. Cl. ..................... 423/348; 423/350
(58) Field of Search ................. 423/348, 350, 423/349

(56) References Cited

U.S. PATENT DOCUMENTS

| | | | |
|---|---|---|---|
| 4,200,621 A | * 4/1980 | Liaw et al. ................. | 117/21 |
| 4,241,037 A | 12/1980 | Pelosini et al. ............. | 423/348 |
| 4,304,763 A | * 12/1981 | Dietl et al. ................. | 423/348 |
| 4,312,847 A | * 1/1982 | Dawless ..................... | 423/348 |
| 4,539,194 A | 9/1985 | Halvorsen ................... | 423/348 |
| 4,798,659 A | * 1/1989 | Dosaj et al. ................ | 423/350 |
| 4,828,814 A | * 5/1989 | Sanjurjo et al. ............ | 423/348 |

FOREIGN PATENT DOCUMENTS

RU    2097320    1/1993

* cited by examiner

*Primary Examiner*—Ngoc-Yen Nguyen
(74) *Attorney, Agent, or Firm*—Muserlian, Lucas and Mercanti

(57) ABSTRACT

The invention relates to a method for purification of metallurgical grade silicon where a calcium containing compound is added to molten silicon prior to or after the silicon is tapped from the furnace. The silicon is cast and solidified at a relatively high cooling rate and the solidified silicon is crushed and subjected to a purification process consisting of two leaching steps. In the first leaching step the silicon is treated with an aqueous solution of $FeCl_3$ or $FeCl_3$ and HCl which causes disintegration of the silicon, and in the second leaching step the silicon is treated with an aqueous solution of HF or $HF/HNO_3$. Calcium-containing compound is added to the molten silicon in an amount necessary to provide between 0.3 and 0.95% by weight of calcium in the molten silicon and the weight ratio between Al and Fe in the molten silicon is regulated to between 0.5 and 2.0 by addition of aluminum to the molten silicon.

2 Claims, No Drawings

REFINING OF METALLURGICAL GRADE SILICON

FIELD OF INVENTION

The present invention relates to a method for production of high purity silicon from metallurgical grade silicon.

BACKGROUND ART

Metallurgical grade silicon contains several metallic and non-metallic impurities which make it unsuited for use in solar cells. The non-metallic impurities such as boron and phosphorus can be reduced mainly by choice of suitable raw materials for production of silicon metal, but this is only possible to a certain degree as regards the most important metallic impurities Fe, Al, Mn, Cu, Ni and others. Raw materials of high purity are however very expensive and it is therefore desirable to procure a simple and cheap purification process by which the metallic impurities can be removed and/or reduced to such a low degree that the purified silicon is suitable for production of solar cells.

It is known that a number of the metallic impurities are rejected by the silicon metal during the crystallization, and that they will crystallize along the grain borders of the silicon, either as intermetallic compounds or as silicides. This is particularly the case for iron and aluminum. The purification of silicon can therefore be done by effecting the crystallization so that the impurities can be collected and removed, for instance by means of crystal drawing, zone melting or similar methods, or by dissolving the impurities by means of an acid which does not attack the silicon metal.

Crystal drawing as well as zone melting are very effective purification methods, but are extremely expensive and require at least double purification of the metallurgical grade silicon before satisfactory solar cell quality is obtained.

From U.S. Pat. No. 4,539,194 it is known a method where molten silicon is alloyed with 1–10% by weight of calcium whereafter the solidified alloy is leached in two steps. In the first leaching step it is used an aqueous solution of $FeCl_3$ and HCl which causes disintegration of the silicon into small silicon particles. In the second leaching step it is used an aqueous solution of HF and $HNO_3$. By this method it is obtained a good purification for both iron and aluminum and also to some extent also for phosphorus. The method according to U.S. Pat. No. 4,539,194 does, however, have some drawbacks. Thus the addition of relatively large amounts of calcium to silicon is costly as the calcium losses during alloying are high and increases with increasing amount of calcium in the silicon. Further, it is difficult to control the leaching reactions in both leaching steps due to high heat evolution and due to formation of silane and $H_2$-gas which can cause self-ignition and explotion. Finally, the high amount of calcium in the silicon causes a relatively high loss of silicon in the form of very fine particulate silicon which are lost in the washing steps carried out after the leaching steps.

DISCLOSURE OF INVENTION

It has now surprisingly been found that a good purification effect, particularly of Fe, can be obtained by addition of a smaller amount of calcium provided that the weight ratio between Al and Fe in the metallurgical grade silicon to be refined is kept within certain limits. At the same time it has been found that a low amount of calcium in the silicon to be refined, result in lower losses of fine particulate silicon.

Accordingly, the present invention relates to a method for purification of metallurgical grade silicon where a calcium containing compound is added to molten silicon prior to or after the silicon is tapped from the furnace, whereafter the silicon is cast and solidified at a relatively high cooling rate and the solidified silicon is crushed and subjected to a purification process consisting of two leaching steps where the silicon in the first leaching step is treated with an aqueous solution of $FeCl_3$ or $FeCl_3$ and HCl which causes disintegration of the silicon, and where the silicon in the second leaching step is treated with an aqueous solution of HF or $HF/HNO_3$, said method being characterized in that the calcium-containing compound is added to the molten silicon in an amount necessary to provide between 0.3 and 0.95% by weight of calcium in the molten silicon and that the weight ratio between Al and Fe in the molten silicon is regulated to between 0.5 and 2.0 by addition of aluminum to the molten silicon.

The weight ratio between Al and Fe is preferably regulated to between 0.6 and 1.2.

It has surprisingly been found that by the method of the present invention it is possible to obtain an iron content in the purified silicon which is as low as in silicon treated according to the method of U.S. Pat. No. 4,539,194 even if the amount of calcium added to the molten silicon is substantially lower than according to the method of U.S. Pat. No. 4,539,194. Further it is obtained an improved control of the reactions which take place in the two leaching steps due to the fact that the amount of silane which forms is substantially reduced and thus reduces the possibility of explosions is reduced. The method according to the invention gives an improved yield of silicon as losses in the form of fine particulate silicon has shown to be reduced with a lower calcium content.

DETAILED DESCRIPTION OF THE INVENTION

Example 1

Varying amounts of calcium and aluminum were added to molten metallurgical grade silicon.

The alloys were cast in moulds at a relatively high cooling rate. The solidified alloys were crushed to a particle size of less than 120 mm and for some of the alloys to a particle size of less than 30 mm. The chemical compositions of these alloys and the weight ratio of Al to Fe are shown in table 1.

Alloy Nos. 2 and 3 in table 1 are in accordance with the invention, while alloy Nos. 1 and 4 in table 1 have a weight ratio of Al to Fe outside the invention.

TABLE 1

| Element | Fe ppmw | Al ppmw | Al/Fe | Ca ppmw | Ti ppmw | P ppmw | B ppmw |
|---|---|---|---|---|---|---|---|
| Alloy 1 | 2980 | 660 | 0.22 | 9200 | 140 | 39 | 7 |
| Alloy 2 | 2100 | 1300 | 0.62 | 8500 | 120 | 52 | 7 |
| Alloy 3 | 2410 | 1850 | 1.18 | 9200 | 180 | 38 | 7 |
| Alloy 4 | 2280 | 5860 | 2.57 | 10200 | 170 | 40 | 7 |

The alloys were thereafter leached in a first leaching step using an aqueous solution of $FeCl_3$ and HCl. The undissolved silicon from the first leaching step was washed with water and thereafter subjected to a second leaching step using a 5% HF solution. The solid silicon from the second leaching step was washed with water.

The purified silicon alloys were analysed for impurities, the results are shown in table 2.

TABLE 2

| Element | Fe ppmw | Al ppmw | Ca ppmw | Ti ppmw | P ppmw | B ppmw |
|---|---|---|---|---|---|---|
| Alloy 1 | 82 | 52 | 450 | 10 | 24 | 6 |
| Alloy 2 | 50 | 70 | 310 | <10 | 16 | 8 |
| Alloy 3 | 55 | 162 | 441 | 7 | 20 | 6 |
| Alloy 4 | 75 | 210 | 255 | 11 | 20 | 6 |

As can be seen from table 2, the removal of impurities is substantially better for alloys Nos. 2 and 3 than for alloy Nos. 1 and 4, where the Al/Fe weight ratio is respectively lower and higher than for alloys Nos. 2 and 3.

What is claimed is:

1. Method for purification of metallurgical grade silicon where a calcium containing compound is added to molten silicon prior to or after the silicon is tapped from the furnace, whereafter the silicon is cast and solidified at a relatively high cooling rate and the solidified silicon is crushed and subjected to a purification process consisting of two leaching steps where the silicon in the first leaching step is treated with an aqueous solution of $FeCl_3$ or $FeCl_3$ and HCl which causes disintegration of the silicon, and where the silicon in the second leaching step is treated with an aqueous solution of HF or $HF/HNO_3$, characterized in that the calcium-containing compound is added to the molten silicon in an amount necessary to provide between 0.3 and 0.95% by weight of calcium in the molten silicon and that the weight ratio between Al and Fe in the molten silicon is regulated to between 0.5 and 2.0 by addition of aluminum to the molten silicon.

2. Method according to claim 1, characterized in that the weight ratio between Al and Fe is regulated to between 0.6 and 1.2.

* * * * *